(12) United States Patent
Kaneko

(10) Patent No.: US 6,721,033 B1
(45) Date of Patent: Apr. 13, 2004

(54) EXPOSURE APPARATUS AND EXPOSURE METHOD

(75) Inventor: Kenichirou Kaneko, Kawasaki (JP)

(73) Assignee: Nikon Corporation (JP)

( * ) Notice: Subject to any disclaimer, the term of this patent is extended or adjusted under 35 U.S.C. 154(b) by 0 days.

(21) Appl. No.: 09/615,461

(22) Filed: Jul. 13, 2000

(30) Foreign Application Priority Data

Jul. 13, 1999 (JP) .......................................... 11-198862
Jun. 26, 2000 (JP) ....................................... 2000-191213

(51) Int. Cl.⁷ ......................... G03B 27/68; G03B 27/42; G03B 27/32; G03F 9/00; A61N 5/00
(52) U.S. Cl. ............................. 355/52; 355/53; 355/55; 355/68; 355/71; 355/77; 430/5; 430/30; 250/492.2; 250/492.22
(58) Field of Search ................. 355/52, 53, 55, 355/68, 71, 77; 430/5, 30; 250/492.2, 492.22

(56) References Cited

U.S. PATENT DOCUMENTS

| | | | | |
|---|---|---|---|---|
| 5,581,324 A | * | 12/1996 | Miyai et al. ................... | 355/67 |
| 5,661,546 A | * | 8/1997 | Taniguchi ..................... | 355/53 |
| 5,710,620 A | * | 1/1998 | Taniguchi ..................... | 355/67 |
| 5,721,608 A | * | 2/1998 | Taniguchi ..................... | 355/53 |
| 5,739,899 A | * | 4/1998 | Nishi et al. | |
| 5,808,910 A | * | 9/1998 | Irie et al. | |
| 5,854,671 A | * | 12/1998 | Nishi .......................... | 355/55 |
| 5,976,737 A | | 11/1999 | Oka ............................ | 430/22 |
| 6,002,487 A | | 12/1999 | Shirata ........................ | 356/400 |
| 6,124,064 A | | 9/2000 | Ozawa ......................... | 430/30 |
| 2003/0035090 A1 | | 2/2003 | Imai et al. .................... | 355/53 |

FOREIGN PATENT DOCUMENTS

JP  11073224 A  3/1999 ............ G05D/3/00

OTHER PUBLICATIONS

US application No. 08/533,923, filed on Sep. 26, 1995 Applicants: Y. Imai, T. Taniguchi and K. Suzuki.
Intellectual Property Office of Singapore (IPOS) Search and Examination Report dated Sep. 25, 2002 for Singapore Application # 200003867-9 (corresponding to the present application).

* cited by examiner

Primary Examiner—Frank G. Font
Assistant Examiner—Khaled Brown
(74) Attorney, Agent, or Firm—Synnesvedt & Lechner LLP

(57) ABSTRACT

A photolithography exposure apparatus exposes a substrate to a pattern image formed on a mask to transfer the pattern onto the substrate. The apparatus includes a substrate stage on which the substrate is mounted. The substrate stage together with the substrate is movable when the substrate is being exposed to the pattern image. A memory stores pattern image distortion information generated in accordance with an exposure position on the substrate when the pattern image is being transferred onto the substrate. A compensator compensates for the distortion so that the pattern is formed cleanly on the substrate.

16 Claims, 9 Drawing Sheets

Fig.5A
Fig.5B
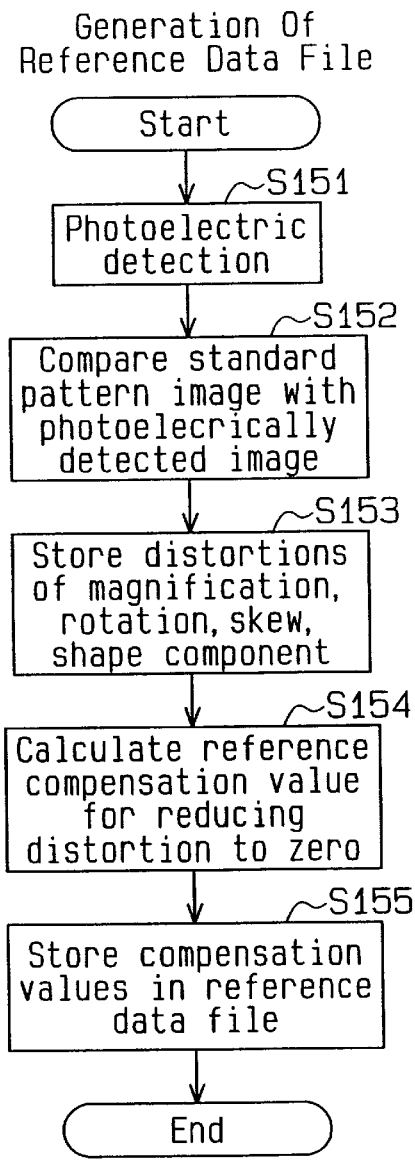
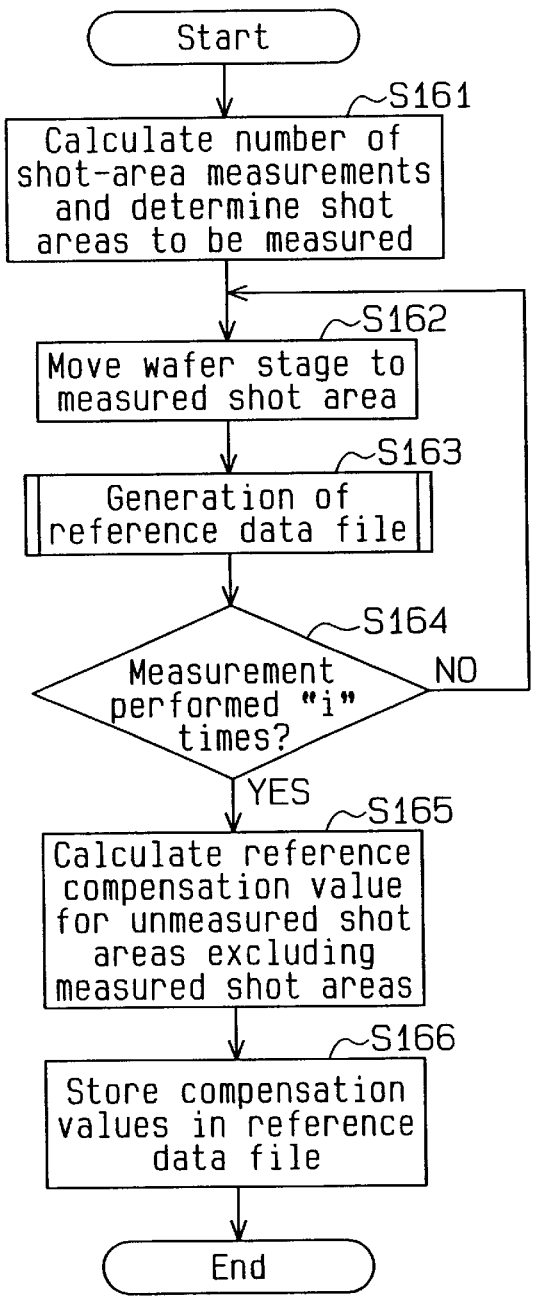

Compensation Value Correstion

Interpolation Correction

EXPOSURE APPARATUS AND EXPOSURE METHOD

BACKGROUND OF THE INVENTION

The present invention relates to an exposure apparatus and an exposure method, and more particularly to an exposure apparatus used for the photolithography process in a process for fabricating semiconductor devices, liquid crystal displays, thin film magnetic heads, or image pickup devices, and an exposure method applied to the photolithography process.

An exposure apparatus is provided with an illumination optical system for illuminating a circuit pattern formed on a mask such as a photomask or reticle. The image of the circuit pattern is projected onto a substrate such as a wafer or glass plate coated with a photosensitive material through a projection optical system and the circuit pattern is transferred onto the substrate. The following is a description of a semiconductor device exposure apparatus for transferring a circuit pattern on a reticle serving as a mask onto a wafer serving as a substrate.

For this type of exposure apparatus, a step and repeat (full wafer exposure type) process is known. The full wafer exposure type exposure apparatus transfers a circuit pattern on a reticle in one shot to a predetermined shot area partitioned on a wafer. The full wafer exposure type exposure is repeated for each of a plurality of shot areas.

A step and scan (scanning exposure)-mode exposure apparatus is also known. The scanning exposure-mode exposure apparatus scans a circuit pattern on a reticle with exposure light shaped like a slit by moving a reticle at a predetermined speed, for example. At the same time, the circuit pattern on the reticle is transferred to the predetermined shot area on a wafer by moving the wafer synchronously with the reticle. Scanning exposure is stepwise for each of a plurality of shot areas.

It is known that distortion such as strain or deformation occurs on the image due to the external environment (atmospheric pressure or temperature), an operating state of the exposure apparatus or a curve of the image face of the reticle. The distortion includes distortions due to magnification, rotation, skew, and a shape component of a shot area. These distortions are described below by referring to FIG. 9.

A standard pattern image 80 is a normal pattern image free from a distortion. Pattern images 81 and 82 respectively have a distortion due to a magnification of a shot area and the pattern image transferred by a projection optical system is enlarged or reduced in size because the magnification of the pattern image is not normal. A pattern image 83 has a distortion due to rotation and is transferred to a position that is rotated from the standard pattern image 80. A pattern image 84 has a distortion due to skew, such that a parallelogram like pattern image that is diagonally shifted from the standard pattern image 80 is transferred due to a shift of synchronous scanning between a reticle stage and a wafer stage. A pattern image 85 has a distortion due to a circuit pattern shape component, such that an irregularly deformed pattern image is transferred. These distortions can occur independently or together.

The distortion of a pattern image may differ for each shot. However, a conventional exposure apparatus does not properly control or compensate for the distortion generated for each shot. Therefore, when a semiconductor device is fabricated, mask superposition accuracy is lowered. Further, when a distortion different for each exposure apparatus occurs when a plurality of exposure devices are used, superposition accuracy is lowered due to the difference between the distortions, and thus the total overlay is deteriorated.

The present invention overcomes such distortion problems. Other aspects and advantages of the invention will become apparent from the following description, taken in conjunction with the accompanying drawings, illustrating by way of example the principles of the invention.

SUMMARY OF THE INVENTION

It is an object of the present invention to provide an exposure apparatus and an exposure method capable of superimposing pattern images with a high accuracy for a shot area on a substrate.

In a first aspect of the present invention, an exposure apparatus for exposing a substrate to a pattern image formed on a mask to transfer the pattern onto the substrate is provided. The apparatus includes a substrate stage on which the substrate is mounted and which is movable together with the substrate when exposing the substrate to the pattern image. A memory device stores distortion information of the pattern image generated in accordance with an exposure position on the substrate when the pattern image is being transferred onto the substrate.

In a second aspect of the present invention, an exposure apparatus for exposing a substrate to a pattern image formed on a mask to transfer the image onto the substrate is provided. The apparatus includes a substrate stage on which the substrate is mounted and which is movable together with the substrate when the substrate is exposed to the image. A compensator compensates for distortion of the pattern image generated in accordance with an exposure position on the substrate when the pattern image is being transferred onto the substrate.

In a third aspect of the invention, a method for exposing a substrate to a pattern image formed on a mask to transfer the pattern onto the substrate is provided. The method includes the steps of obtaining pattern image distortion information generated in accordance with an exposure position on the substrate when the pattern image is being transferred onto the substrate, and exposing the substrate to the pattern image in accordance with the distortion information.

BRIEF DESCRIPTION OF THE DRAWINGS

The invention, together with objects and advantages thereof, may best by understood by reference to the following description of the presently preferred embodiments together with the accompanying drawings in which:

FIG. 5A is a flow chart for generating a reference data file in accordance with the present invention;

FIG. 5B is a flow chart for interpolation calculation;

DETAILED DESCRIPTION OF THE PREFERRED EMBODIMENTS

An embodiment of an exposure apparatus of the present invention will be described below by referring to FIGS. 1 to 6. The exposure apparatus of this embodiment is used for fabrication of semiconductor devices and can perform the scanning exposure mode and the full wafer exposure type exposure mode. In this specification, the exposure apparatus is described with reference to the scanning exposure mode.

Figure 3:
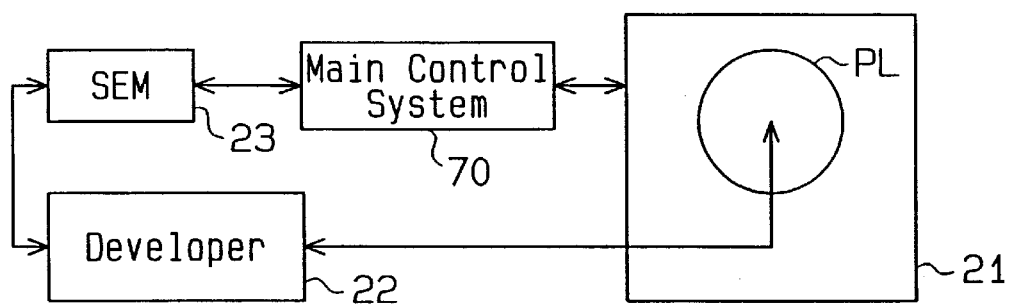
FIG. 3 is a schematic block diagram showing an exposure system including an exposure apparatus of the present invention.

As shown in FIG. 3, the exposure system comprises an exposure apparatus 21, a developer 22, and a scanning-type electron microscope (SEM) 23. The exposure apparatus 21 projects and transfers the image of a circuit pattern drawn on a reticle R onto a layer of a photosensitive material such as photoresist of a wafer W. The developer 22 develops a pattern image serving as a latent image formed on the photosensitive material layer to form a circuit pattern. The SEM 23 views the circuit pattern formed by the developer 22.

Figure 1:
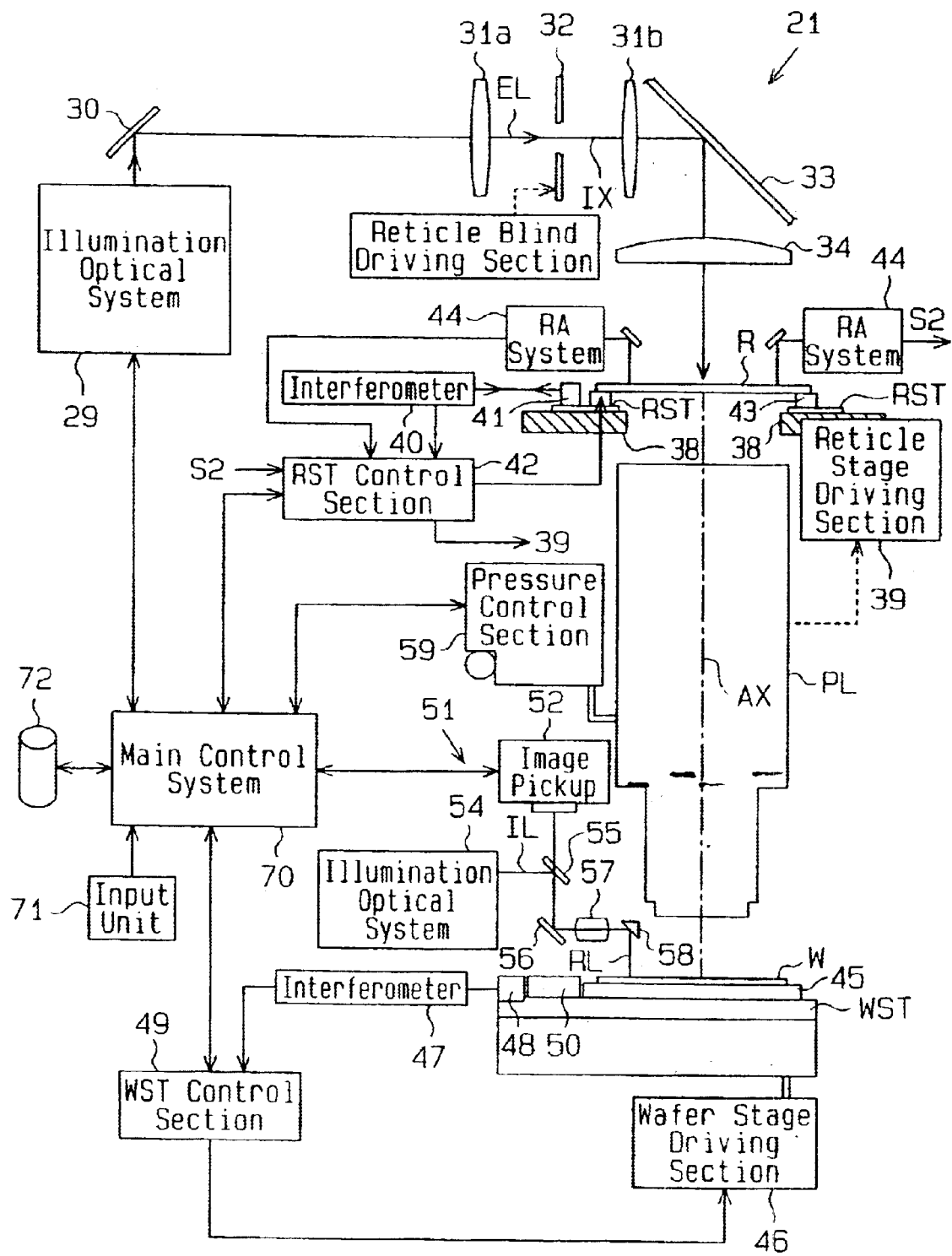
FIG. 1 is a schematic block diagram showing an exposure apparatus according to an embodiment of the present invention.

As shown in FIG. 1, the exposure light EL emitted from an illumination optical system 29 including an exposure light source, a collimator lens, an interference filter, a fly-eye lens, and an aperture stop (σ stop) is reflected at a beam splitter 30. The exposure light EL includes excimer laser beams of KrF, ArF, or $F_2$, harmonics of a metal vapor laser or a YAG laser, or bright rays of an extra-high-voltage mercury lamp such as g-rays, h-rays, i-rays or the like. The exposure light EL reflected by the beam splitter 30 enters the reticle R through relay lenses 31a' and 31b, a reticle blind 32, a mirror 33 and a condenser lens 34 to illuminate an illumination area IA of the reticle R with almost uniform illuminance. The collimator lens, fly-eye lens, relay lenses 31a and 31b, and reticle blind 32 in the illumination optical system 29 constitute an illumination system 29.

The reticle blind 32 has an opaque face conjugate with the pattern area of the reticle R. The reticle blind 32 includes a plurality of movable opaque portions (e.g. two L-shaped movable opaque portions) which can be opened or closed by a reticle blind driving section 32a. By adjusting the size (slit width) of an opening formed by these movable opaque portions, the illumination area IA (refer to FIG. 2) for illuminating the reticle R is optionally set.

The reticle R is held with a vacuum force to a reticle stage RST serving as a mask stage set on a base 38. The reticle stage RST is slightly movably set on the base 38 in a two-dimensional direction through an air bearing and the reticle R is positioned by the reticle stage RST in a plane orthogonal to the optical axis IX of the exposure light EL. The reticle stage RST can be moved in a predetermined direction (scanning direction) on the base 38 by a reticle stage driving section 39 having a linear motor or the like.

A mobile mirror 41 for reflecting a laser beam emitted from an interferometer 40 is fixed to an end of the reticle stage RST. A scanning-directional position of the reticle stage RST is detected by the interferometer 40 at a resolution of approx. 0.01 μm and the positional information 30 is sent to a reticle stage control section 42. The reticle stage control section 42 controls the reticle stage driving section 39 in accordance with the positional information of the reticle stage RST, and thus controls movement of the reticle stage RST.

The reticle stage RST is permitted to move slightly in the IX direction (Z direction) of an optical axis by a reticle driving device 43. The reticle driving device 43 can use a piezo-electrostrictive device or an air damper. To move the whole reticle stage RST, it is preferable to use three or four reticle driving devices 43. Each driving device 43 is connected to the reticle stage control section 42.

A pair of reticle alignment systems (RA systems) is set near the reticle R. The RA systems 44 detect a pair of reticle alignment marks (RA marks) formed on the periphery of the reticle R and reticle alignment reference marks (RA reference marks) projected to positions extremely close to the RA marks from a reference plate 50. A measurement signal output from the RA system 44 is supplied to the reticle stage control section 42. The reticle stage control section 42 slightly moves the reticle stage RST in accordance with the measurement signal and positions the reticle R so that the center of the illumination area IA coincides with the optical axis AX of a projection optical system PL.

The exposure light EL passing through the reticle R enters the projection optical system PL whose both sides are telecentric. The projection optical system PL contracts a circuit pattern on the reticle R to ⅕ or ¼ and projects the contracted image onto a wafer W whose surface is coated with photoresist photosensitive to the exposure light EL.

Figure 2:
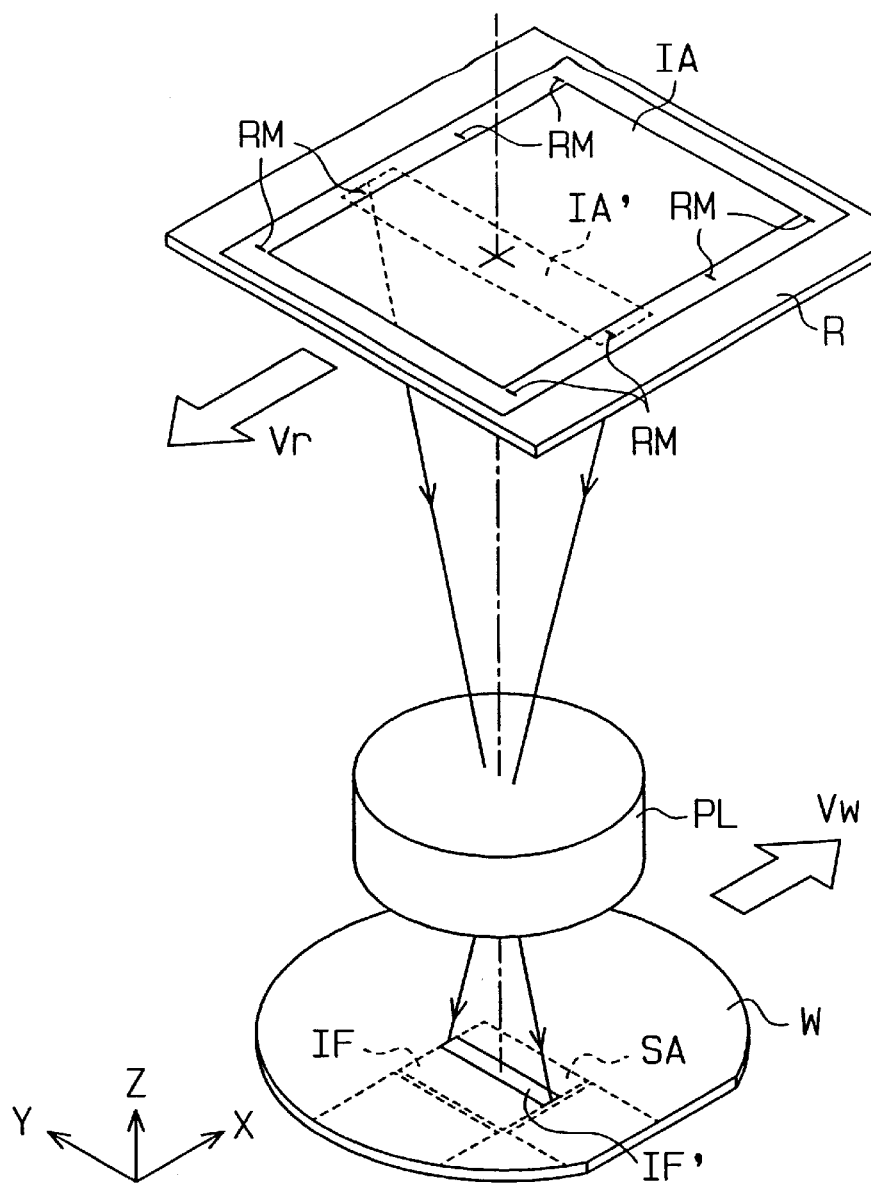
FIG. 2 illustrates synchronous scanning between a reticle and a wafer.

As shown in FIGS. 1 and 2, when a circuit pattern on the reticle R is exposed to the predetermined exposure area (shot area) SA on the wafer W through scanning in accordance with the step and scan mode, an illumination area IA' on the reticle R is shaped into a rectangle (slit) by the reticle blind 32. By scanning the reticle R in +X direction shown by an arrow Vr at a predetermined speed when exposing the reticle R, a circuit pattern on the reticle R in the slitlike illumination area IA' is illuminated from one end to the other end. Thereby, the circuit pattern on the reticle R in the illumination area IA' is projected to a projection area IF' on the wafer W.

The wafer W has an inverted-imaging relation with the reticle R. Therefore, the wafer W is scanned at the predetermined speed synchronously with scanning of the reticle R in the direction (−X direction) opposite to the direction of the arrow Vr. The entire shot area SA of the wafer W is thus exposed. A scanning-speed ratio Vw/Vr between a reticle and a wafer is set in accordance with the minimum magnification of the projection optical system PL and the circuit pattern on the reticle R is contracted and accurately transferred onto each shot area SA on the wafer W. To illuminate the entire circuit pattern undergoing scanning, the width of the illumination area IA' in the longitudinal direction is set to a value larger than the width of the opening of the reticle R in the longitudinal direction.

As shown in FIG. 1, the wafer W is held by vacuum force by a wafer holder 45 and set onto a wafer stage WST serving as a substrate stage through the wafer holder 45. The wafer holder 45 can be tilted in any direction from the optimum imaging plane of the projection optical system PL by an unillustrated driving section and slightly moved in the AX direction (Z direction) of the optical axis of the projection optical system PL. Because the wafer stage WST is moved by a wafer stage driving section 46 preferably comprising a motor not only in the scanning direction (X direction) but also to any shot area SA, it is also able to move in the direction (Y direction) vertical to the scanning direction. Thereby, the step and scan operation is performed in which the scanning exposure operation of each shot area SA on the wafer W and movement to the next scanning exposure are repeated.

A mobile mirror 48 for reflecting a laser beam emitted from a second interferometer 47 is fixed to the wafer stage WST and an XY-directional position of the wafer stage WST is detected by the interferometer 47 at a resolution of, for example, approx. 0.01 μm. Positional information (or speed information) of the wafer stage WST is sent to a wafer stage control section 49 and the wafer-stage control section 49 controls the wafer-stage driving section 46 in accordance with the positional information (or speed information).

The reference plate 50 is provided on the wafer stage WST. The reference plate 50 is provided to have almost the same height as the surface of the wafer W. The reference plate 50 has an RA reference mark and the RA reference mark is used to detect a reference position of transfer exposure (in this case, relative position of the reticle R to the center of the exposure field of the projection optical system PL). The RA reference mark is preferably a luminous mark and the mark is projected to a position extremely close to a reticle alignment mark (RA mark) on the reticle R through the projection optical system PL. A wafer alignment reference mark (WA reference mark) is also formed on the reference plate 50. The WA reference mark is used to detect an offset value relating to a shift between a reference position of transfer exposure and a reference position of a photodetector 51 (in this case, the center of an observation field of the photodetector 51).

The photodetector 51 is provided at the lateral of the projection optical system PL and detects a focused state of a pattern image projected onto the wafer W and a WA reference mark on the reference plate 50. The photodetector 51 acts as a photodetector and a measuring device for measuring the information for distortion and uses a focusing mode for focusing and detecting a pattern image and a WA reference mark using an image pickup device 52.

The photodetector 51 has an illumination optical system 54 preferably including a halogen lamp, a condenser lens, an optical fiber, an interference filter, and a lens system. Light components of the photosensitive wavelength band and infrared wavelength band of a photoresist layer are cut from wide-band illumination light IL emitted from the halogen lamp via the interference filter. The illumination light IL enters a telecentric objective lens 57 through a beam splitter 55 and a mirror 56. The illumination light IL emitted from the objective lens 57 is reflected by a prism 58 located near a lower portion of the lens barrel of the projection optical system PL and the reflected light is irradiated to the wafer W without interrupting the illumination field of the projection optical system PL.

The projection area IF' on the wafer W is illuminated by the above irradiation and the reflected light RL reflected from the projection area IF' is introduced into the image pickup device 52 through the prism 58, objective lens 57, mirror 56, and beam splitter 55. An unillustrated transparent window and an unillustrated lens system are set in the image pickup device 52 and the reflected light RL is focused in the transparent window and the focused image is photoelectric-converted into an imaging signal through a lens system after being photographed. The imaging signal is supplied to a main control system 70 and the main control system 70 waveform-processes the imaging signal for each shot area to generate the distortion information for each shot area of a pattern image. It is possible to selectively perform measurement by the photoelectric detector 51 for all or some of the shot areas.

A pressure control section 59 for controlling the pressure in the projection optical system PL is connected to the projection optical system PL.

The main control system 70 controls the illumination optical system 29, reticle stage control section 42 and wafer stage control section 49, photoelectric detector 51, and pressure control section 59. An input unit 71 preferably including a keyboard and a bar code reader is connected to the main control system 70. By using the input unit 71, an operator can input various pieces of information such as size of wafer W, projection magnification, opening degree of the reticle blind 32 (illumination-slit width), target exposure value, scanning rate, and information on a standard pattern image (normal pattern image having no distortion), selective information on whether all or some shot areas is to be measured by the photoelectric detector 51, and frequency for measuring some shot areas (e.g. 50%).

A hard disk drive 72 serving as a memory and a parameter calculator is connected to the main control system 70. The hard disk drive 72 stores standard pattern image information and distortion information of a pattern image for each shot area. The main control system 70 compares the distortion information for each shot area generated by the photoelectric detector 51 with the standard pattern image information in the corresponding shot area and calculates a compensation value for every component of each distortion. The calculated compensation value is stored in a reference data file defined for each shot area. The distortion information includes a magnification of a shot area by the projection optical system PL, rotation according to alignment between the reticle R and wafer W, skew due to synchronous scanning between the reticle stage RST and wafer stage WST, and information about shape components of circuit patterns in which these distortions are mixed.

Operations of the exposure apparatus 21 are described below by referring to the flow charts in FIGS. 4 to 6.

Figure 4A:
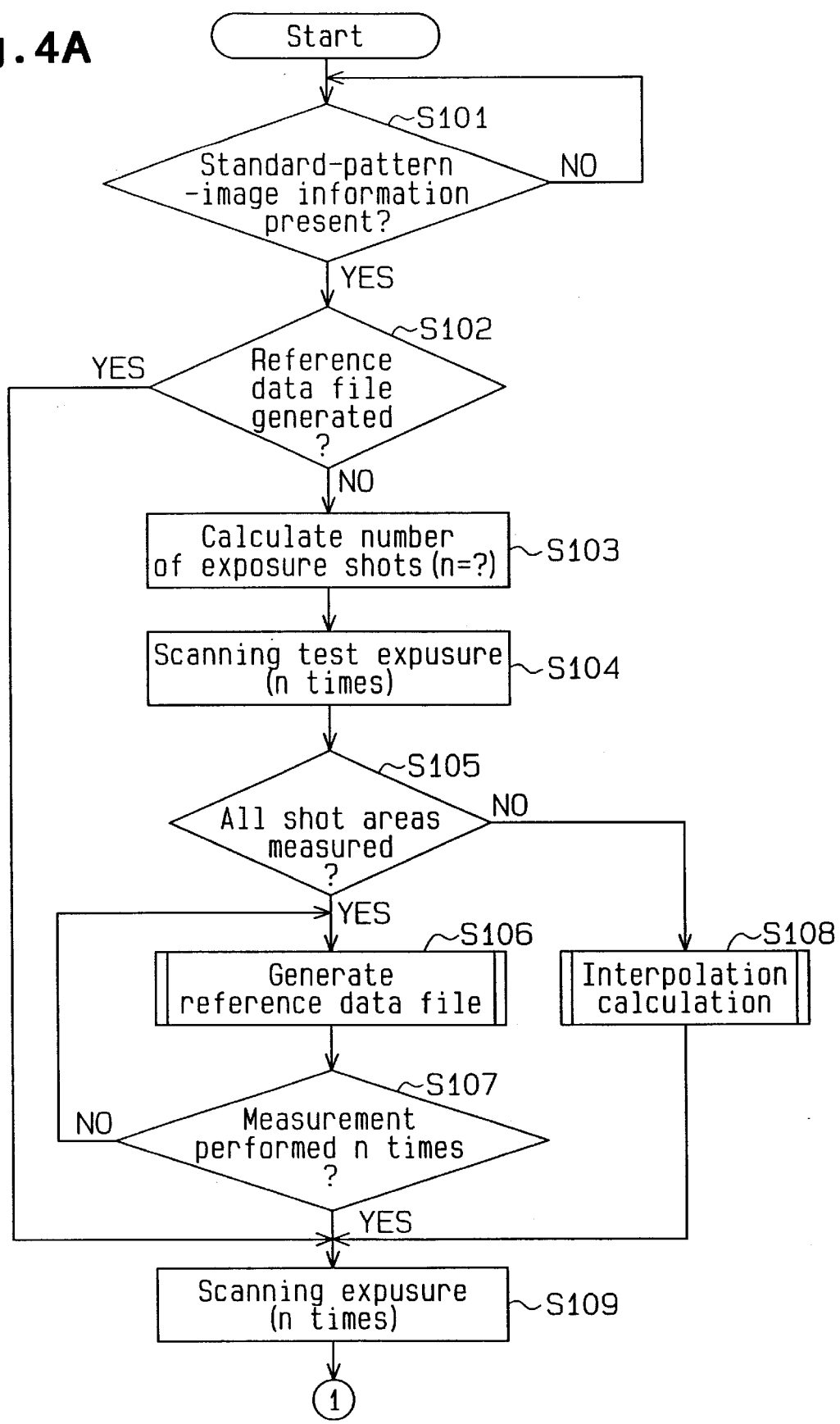
FIGS. 4A and 4B are a flow chart for exposure operations.

As shown in FIG. 4A, when an operator commands the main control system 70 to start operations of the exposure apparatus 21 by operating the input unit 71, the main control system 70 determines whether the information of the standard pattern image corresponding to the reticle R is stored on the hard disk drive 72 (S101). When the information of the standard pattern image is not stored on the hard disk drive 72, the main control system 70 waits for standard-pattern image information to be input by the operator. However, when the standard-pattern image information is stored on the hard disk drive 72, the main control system 70 determines whether a reference data file having a compensation value for each shot area has already been generated (S102). When the reference data file has not been generated yet, the main control system 70 calculates the number of shots "n" necessary for scanning exposure in accordance with a size of the wafer W and a projection magnification set through the input unit 71. Then, the main control system 70 synchronously scans the reticle R and wafer W to perform a test exposure in which the pattern of the reticle R is scanned on the wafer W "n" times (S104). The test-exposed wafer W is moved to the developer 22 from the exposure apparatus 21 and returned to the exposure apparatus 21 after a test pattern transferred onto the wafer W is developed.

Then, the main control system 70 determines whether distortion information on all shot areas is to be measured using the photoelectric detector 51 (S105). When all shot areas are measured, the main control system 70 starts generating a reference data file (S106).

As shown by the flow chart in FIG. 5A, when generating the reference data file, the photoelectric detector 51 photo-electrically detects a developed test pattern image for each shot area, generates an imaging signal, and supplies the imaging signal to the main control system 70 (S151). Then, the main control system 70 compares the photoelectrically detected images with the standard pattern image (S152). The main control system 70 obtains distortions of magnification, rotation, skew, and shape component in accordance with the comparison result and stores distortion parameters on the hard disk drive 72 (S153). Then, the main control system 70 calculates reference compensation values for reducing the values of the distortions to zero (S154) and stores the compensation values in the reference data file on the hard disk drive 72 (S155).

Then, in S107 in the flow chart of FIG. 4A, the main control system 70 determines whether all of shot areas have been measured "n" times. When measurement has not yet been performed "n" times, steps S106 and S107 are repeated until all of shot areas have been measured.

In S105, when it is determined that only some of the shot areas have been measured, interpolation calculation is started (S108). As shown by the flow chart in FIG. 5B, in the interpolation calculation, the main control system 70 first calculates the number of measurement times of shot areas ("i" times) and determines measurement portions of shot areas corresponding to the number of measurement times (S161). The number of measurement times is calculated in accordance with the number of all of the shot areas SA and a measurement frequency (e.g. 50%) supplied by the input unit 71, and the shot areas to be measured are determined by uniformly distributing the number of shots "i". Therefore, for a measurement frequency of 50%, the shot areas to be measured are determined so that shot areas are measured in alternate areas.

Then, the main control system 70 moves the wafer stage WST to a measured shot area (S162) to generate a reference data file for the measured shot area (S163). The generation of the data file is performed in accordance with the flow chart in FIG. 5A similar to the case of the measurement of all of the shot areas.

Returning to the flow chart in FIG. 5B, the main control system 70 starts the processing in S164 to determine whether generation of a reference data file is performed less than "i" times. When the measurement has not yet been performed "i" times, steps S162 and S163 are repeated. When generation of the reference data file is completed, the main control system 70 performs interpolation calculation for shot areas except the measured shot areas in order to calculate reference compensation values (S165). In the interpolation calculation, estimated compensation values are calculated for those shot areas not yet measured. That is, when the parameter of a certain distortion proportionally increases or decreases, its compensation value also proportionally increases or decreases. Moreover, when an unmeasured shot area is present between two measured shot areas, the average value of compensation values of the two measured shot areas is set as an estimated compensation value of the unmeasured shot area. The estimated compensation value thus calculated is stored in the reference data file on the hard disk drive 72 (S166) and interpolation calculation is completed.

Then, in the flow chart shown in FIG. 4A, when a reference data file has already been generated (S102), generation of the reference data file is performed "n" times (S107) or interpolation calculation (S108) is completed, the main control system 70 starts the processing in S109 and mounts a new wafer W on the wafer stage WST to start scanning exposure. The main control system 70 compensates for distortions using the compensation values stored in the reference data file to perform scanning exposure. For example, a distortion of magnification is compensated for by slightly moving the wafer stage WST or reticle stage RST in Z direction, adjusting the pressure in the projection optical system PL by the pressure control section 59 or moving a plurality of unillustrated lens elements in the projection optical system PL. A distortion of rotation is compensated for by slightly moving the wafer stage WST or reticle stage RST in the X or Y direction. Moreover, a distortion of skew is compensated for by adjusting the scanning rate Vw or Vr of the wafer stage WST or reticle stage RST. Furthermore, a distortion of a shape component is compensated for by using known means for compensating for an aberration and an image face curve in addition to the above adjustment.

When the scanning exposure is completed, the exposed wafer W is moved to the developer 22 from the exposure apparatus 21, a pattern projected and transferred to the wafer W is developed, and the wafer W is returned to the exposure apparatus 21. The main control system 70 determines whether compensation values in the reference data file are to be corrected in accordance with the information input from the input unit 71 (S110 of FIG. 4B). When correcting the compensation values, the main control system 70 determines whether distortion information for all of shot areas is to be measured in accordance with the information input from the input unit 71 (S111). When measuring all of the shot areas, the main control unit 70 starts the compensation-value correction (S112).

Figure 6A:
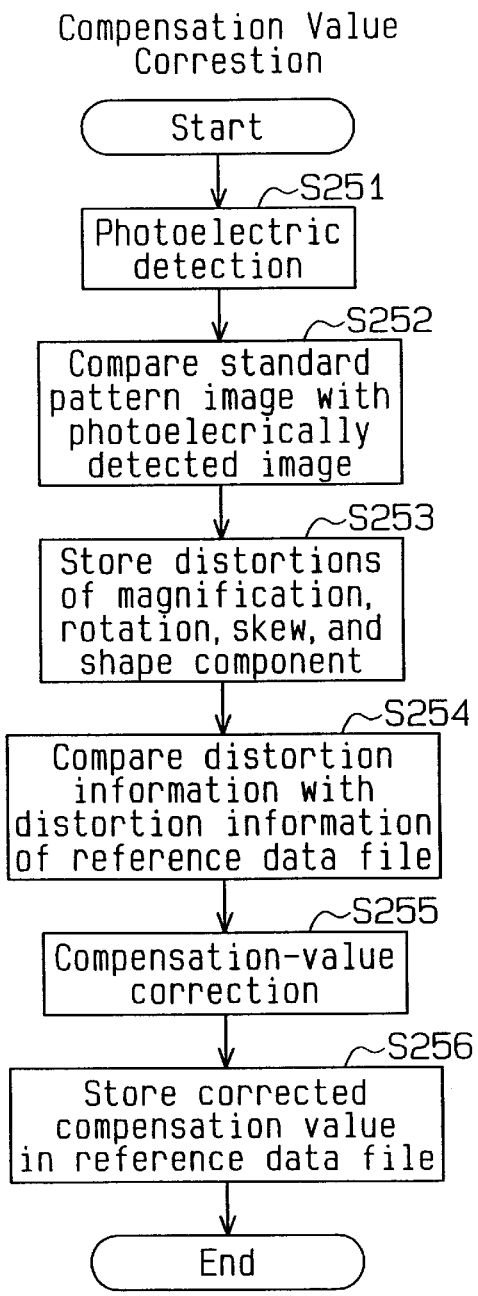
FIG. 6A is a flow chart for compensation value correction in accordance with the present invention.

As shown by the flow chart in FIG. 6A, in the case of compensation value correction, a developed pattern image is first photoelectrically detected by the photoelectric detector 51 every shot area (S251). Then, the main control system 70 compares the photoelectrically detected image with the standard pattern image (S252), generates information on distortions of magnification, rotation, skew, and shape component in accordance with the comparison result, and stores the distortion information on the hard disk drive 72 as actual parameters (S253). Then, the main control system 70 compares each piece (actual parameter) of the distortion information with each piece (parameter) of the distortion information of the standard pattern image stored in the reference data file in S153 (S254). When different distortion information is present, the main control system 70 corrects compensation values in accordance with the comparison result (S255). The main control system 70 stores the corrected compensation values in the reference data file on the hard disk drive 72 (S155).

Figure 4B:
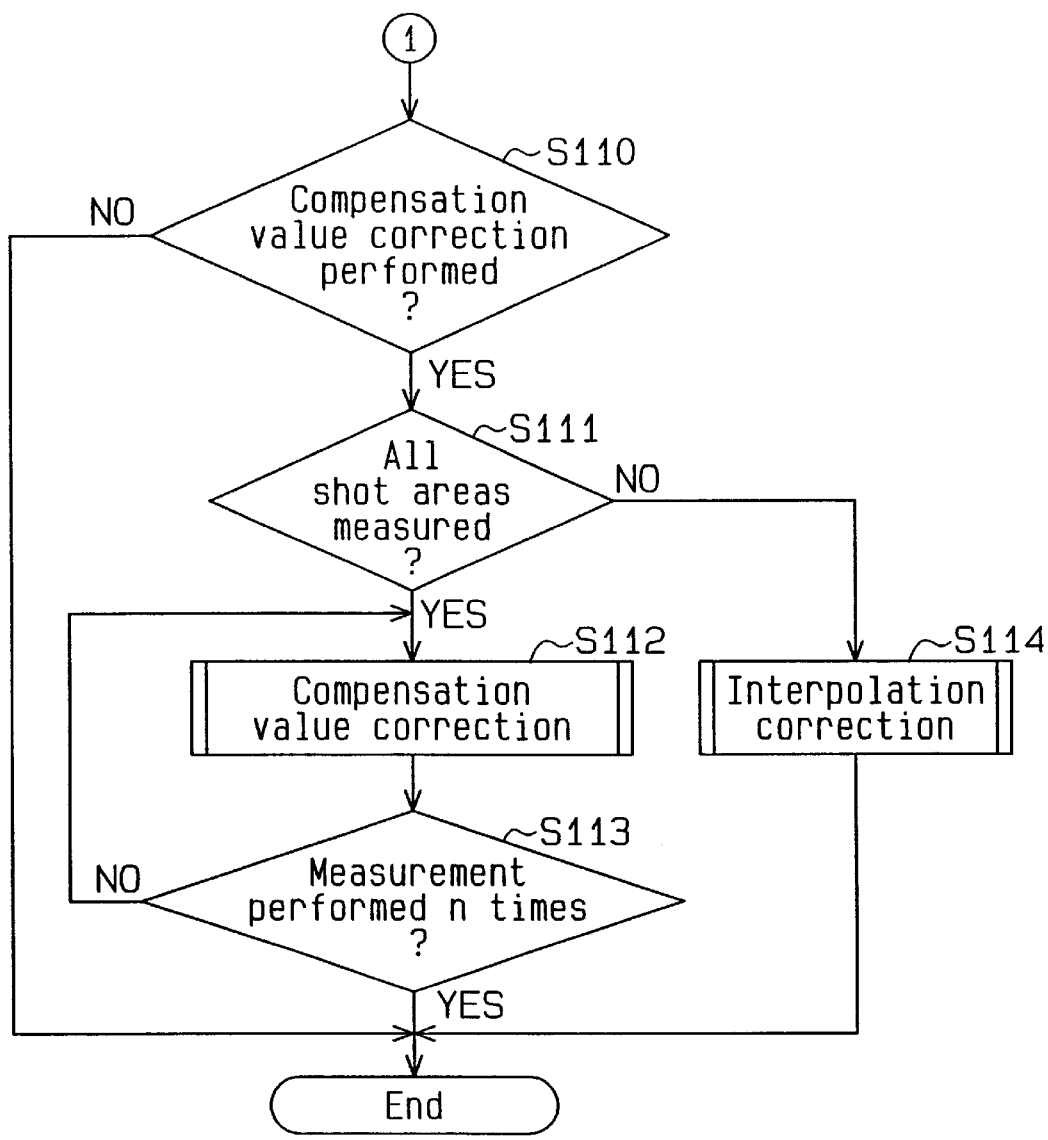

Then, in S113 in the flow chart of FIG. 4B, the main control system 70 determines whether measurement is performed by the number of all of the shot areas ("n" times). When measurement has not yet been performed "n" times, steps S112 and S113 are repeated.

When it is determined in step S111 that compensation values are corrected for some shot areas, interpolation correction is started (S114).

Figure 6B:
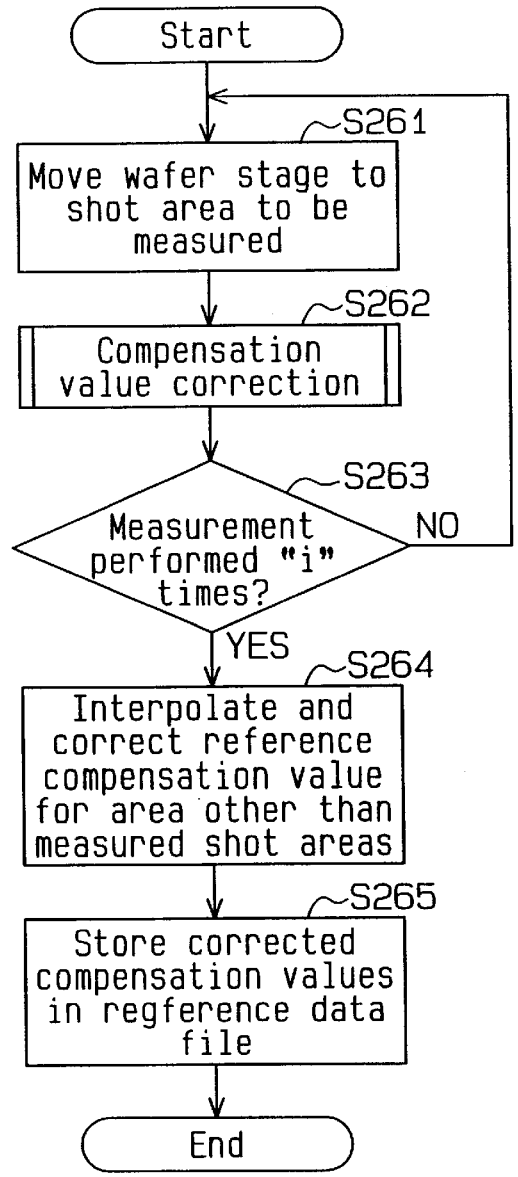
FIG. 6B is a flow chart for interpolation correction.

As shown by the flow chart in FIG. 6B, in the case of interpolation correction, the main control system 70 moves the wafer stage WST to a shot area for compensation value correction (S261) and performs compensation value correction for the shot area (S262). Compensation value correction is performed in accordance with the flow chart of FIG. 6A similar to the case of all of the shot areas.

Then, in the flow chart of FIG. 6B, the main control system 70 determines whether interpolation correction has been performed "i" times (S263). When measurement has not yet been performed "i" times, steps S261, S262, and S263 are repeated until measurement has been performed "i" times. When the compensation value correction is completed, interpolation values of shot areas except the measured shot areas are corrected (S264). Then, corrected compensation values are stored in the reference data file in the hard disk drive 72 (S265) and interpolation correction is completed.

In the flow chart of FIG. 4B, when compensation value correction is performed (S110), compensation value correction is performed "n" times (S113), interpolation correction is completed (S114), or operations of the exposure apparatus 21 are completed. A series of steps shown by the flow chart in FIGS. 4A and 4B are taken when scanning-exposing a new wafer W and when performing exposure with another reticle R.

In this embodiment, distortion information is generated for each shot area on a wafer and stored on the hard disk drive 72. The present invention is not restricted to this embodiment. For example, the surface of a wafer may be divided into a plurality of areas (e.g. four quadrants) and distortion information may be stored in the hard disk drive 72 for each partial area. It is possible to obtain the distortion information for each partial area by obtaining distortion information of a plurality of shot areas present in the partial area and statistically computing (e.g. averaging) these pieces of distortion information.

The number of divisions of the surface of a wafer and shapes of divided partial areas are not restricted. Not only is it permitted to use the above four quadrants but also to divide a wafer into top and bottom areas or divide a wafer into a plurality of annular areas from the center of the wafer toward the circumference. By using each partial area as a shot area, it is possible to process each partial area similarly to the case of the above embodiment.

It is also permitted not only to store distortion information in relation to partial areas on a wafer but also to store distortion information by making the information relate to positional information of the wafer stage WST on which a wafer is mounted. Specifically, XY-coordinate values of the wafer stage WST when exposing each shot area on the wafer W are obtained using measured values of the interferometer 47. The distortion information for each shot area is related to the XY-coordinate values and stored. Relating the distortion information to the XY-coordinate values makes it possible to calculate the distortion information corresponding to any exposure position independent of the exposure position of a wafer stage by using the stored distortion information even if a shot area or wafer size differs.

In the case of exposure in this embodiment, compensation is performed in accordance with the distortion information for each shot area (distortion information intrinsic to an apparatus, which may be generated when exposing each shot area). It is also permitted not only to perform the above compensation but also to compensate for an exposure condition by considering deformation information of each shot area caused by deformation of a wafer. Deformation information of each shot area (distortion information of each shot area) is obtained by detecting an alignment mark provided for each of a plurality of sample shot areas in a wafer before exposure. Obtaining such deformation information before exposure is disclosed in Japanese Unexamined Patent Publication No. 7-57991 (U.S. patent application Ser. No. 08/533,923) and Japanese Unexamined Patent Publication No. 9-7921 (U.S. Pat. No. 6,002,487).

It is not necessary to set the hard disk drive 72 for storing distortion information for each shot area in a computer in the exposure apparatus 21. It may be set in a host computer or work station connected to a plurality of exposure apparatuses through a network such as LAN. In this case, it is possible for the host computer to collectively control pieces of distortion information of the exposure apparatuses and select a combination of exposure apparatuses in which the matching accuracy of distortions is optimum in a series of lithography processes.

Therefore, the exposure apparatus 21 of this embodiment has the following advantages.

(a) The exposure apparatus 21 stores distortion information of a pattern image in the reference data file in the hard disk drive 72 for each shot area when performing scanning exposure. Therefore, even when the distortion of a pattern image differs for every shot area, it is possible to control the distortion information for every shot area. The distortion of the pattern image is compensated for every shot area by using the distortion information stored in the hard disk drive 72. Therefore, the transfer accuracy when superposing a plurality of reticles on each other is improved in fabricating a semiconductor device and the difference between distortions of a plurality of exposure apparatuses is compensated. As a result, the total overlay is improved.

(b) Compensation values stored in the reference data file through the compensation value correction (S112) and interpolation correction (S114) are corrected in accordance with an actual exposure state. Therefore, even if distortions are changed due to an operating state or operating frequency, compensation values are quickly corrected.

(c) The main control system 70 generates the information of distortions of magnification, rotation, skew, and shape component of each shot area and stores the distortion information on the hard disk drive 72 using the distortions as parameters. Therefore, proper compensation is performed in accordance with each distortion and compensation value correction can be performed for each parameter.

(d) Distortion information is accurately and quickly measured for each shot area using the photoelectric detector 51 and distortions are compensated for in accordance with the distortion information. Moreover, because the distortion information is automatically detected by the photoelectric detector 51, it is unnecessary to measure distortions using the SEM 23.

(e) It is possible to select a reference data file generation process or compensation value correction process for all or some of the shot areas. Therefore, when the generation or compensation is performed for all shot areas, the distortion of each shot area is accurately corrected. When the generation or compensation is performed for some shot areas, the distortion information for a shot area for which the generation or compensation is not performed is generated using estimated compensation values calculated through interpolation calculation and interpolation correction. Thus, the processing speed is improved because it is unnecessary to process all shot areas.

It should be apparent to those skilled in the art that the present invention may be embodied in many other specific forms without departing from the spirit or scope of the invention. Particularly, it should be understood that the invention may be embodied in the following forms.

For the above embodiment, the scanning exposure mode was described. However, the exposure apparatus 21 also operates through the full wafer exposure type exposure mode similar to the case of the scanning exposure mode. In this case, as the entire surface of the illumination area IA on the reticle R is illustrated, the opening of the reticle blind 32 is shaped into substantially a square form, as shown in FIG. 2. Moreover, while the reticle R and the wafer W are stationary, a circuit pattern on the reticle R in the illumination area IA is projected to the shot area SA on the wafer W by one shot through the projection optical system PL.

It is unnecessary for parameters of distortion information to include all of the magnification, rotation, skew, and shape component. It is also permitted to set only a parameter having an occurrence rate higher than that of other distortion. For example, in the case of the full wafer exposure type exposure mode, a probability that a distortion of skew mainly caused by synchronous scanning occurs is comparatively small because the reticle stage RST and wafer stage WST are not synchronously scanned. Therefore, in the case of the full wafer exposure type exposure, a skew parameter may be omitted. Moreover, when it is experientially known that a distortion rarely occurs in a pattern image at the central portion of the wafer W, but frequently occurs close to the circumference of the wafer W, the number of types of parameters may be decreased at the central portion of the wafer W. That is, it is permitted to adjust the number of parameters in accordance with the position of the wafer W. Thus, by omitting or adjusting the number of parameters, distortion compensation is quickly performed.

The SEM 23 may be used instead of the photoelectric detector 51. In this case, the scanning test exposure (S104), scanning exposure (S109), and development of a pattern of the wafer W by the developer 22 are performed, then the wafer W is moved to the SEM 23, and the wafer W is directly observed. Pattern formation states (dimensions, faded degree, and deflected degree) are observed through the SEM 23 and distortion information is generated in accordance with the observation result. In this case, it is preferable to be able to input the distortion information with the input unit 71. In this case, an exposure apparatus can be simplified because it is unnecessary to use the photoelectric detector 51.

The photoelectric detector 51 and/or the reticle alignment (RA) system 44 may be used as a measuring apparatus(es). In this case, the light of the photosensitive wavelength and infrared wavelength of the exposure light EL is cut by an interference filter in an illumination system and a pattern image is projected onto the wafer W. Then, reflected light of the pattern image is detected by the RA system 44. Then, the main control system 70 receives a measurement signal from the RA system 44 through the reticle stage control section 42 and performs reference-data-file generation and interpolation calculation in accordance with the measurement signal. In this case, it is possible to correct the compensation value of a distortion before scanning exposure is started.

A parameter of distortion may be cumulatively stored in the hard disk unit 72 whenever measurement is performed. In this case, a counter for measuring the number of occurrence times of parameters may be provided to display the number of occurrence times of distortions on a monitor or print it. Because distortion occurrence states can be obtained from the above cumulative information, it is possible to effectively use the information for maintenance and improvement of the exposure apparatus 21.

The exposure apparatus of this embodiment may be manufactured by incorporating and optically adjusting an illumination optical system and a projection optical system in the body of the exposure apparatus. A wafer stage (reticle stage included for scan type exposure apparatus) is then attached to the exposure apparatus body and wires are connected to the wafer stage. A gas supply pipe is further connected to supply gas to the optical path of the exposure light. Total adjustment (electric adjustment) is then performed to complete the manufacture of the exposure apparatus.

The components of the devices for holding optical members are assembled after eliminating impurities, such as machining oil and metal substances, through ultrasonic cleaning. It is preferred that the exposure apparatus be manufactured in a clean room, the temperature and humidity of which is controlled and the cleanness of which is adjusted.

The method for manufacturing a device using the exposure apparatus during the lithography step will now be described.

Figure 7:
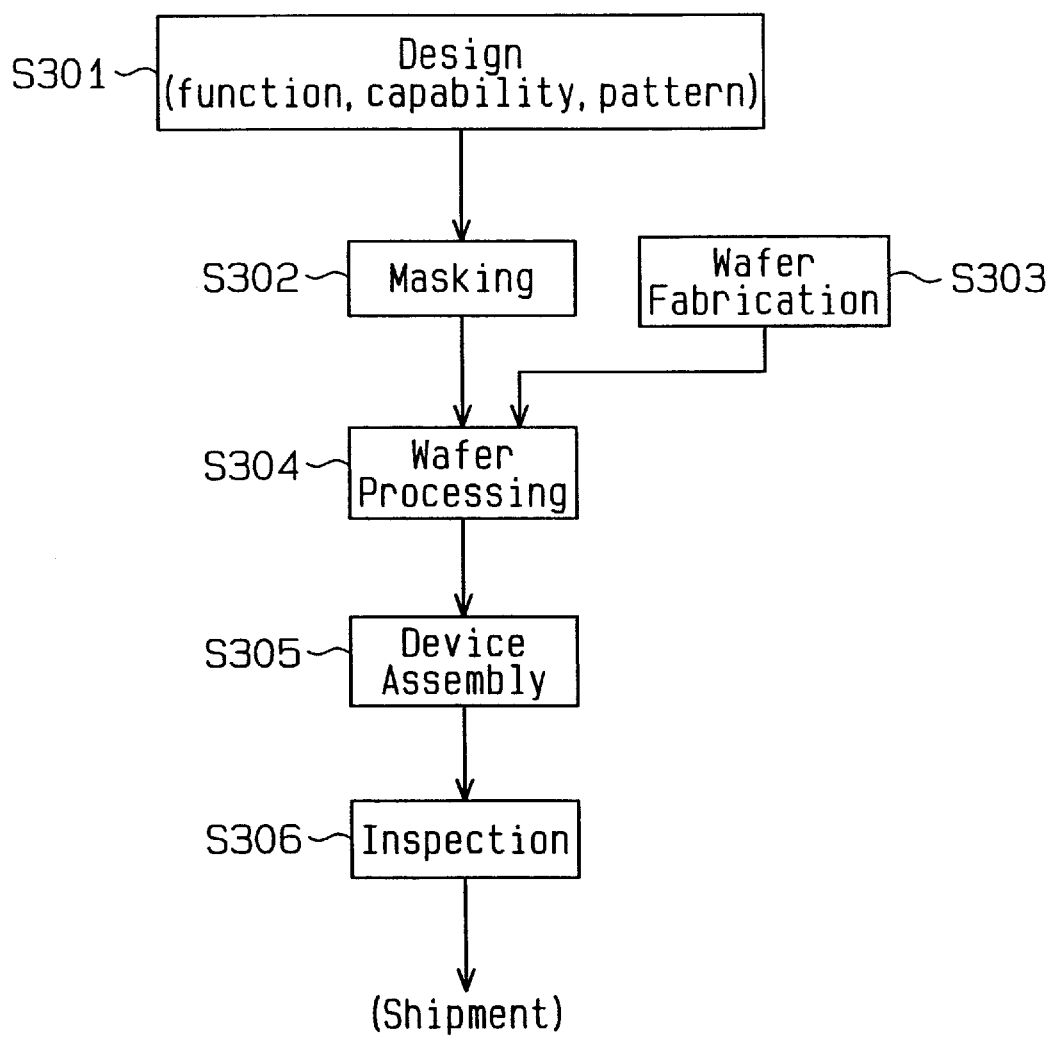
FIG. 7 is a flow chart for a device manufacturing process.

FIG. 7 is a flowchart showing one example of how the device (e.g., semiconductor chip such as an IC or LSI, liquid crystal panel, CCD, thin film magnetic head, micromachine) is manufactured. As shown in FIG. 7, at step S301 (design step), the function and capability of the device (microdevice) are designed (e.g., circuit design of semiconductor device) and patterns are designed to achieve the function. Then at step S302 (masking step), a mask (reticle) having the designed pattern is formed. In step S303 (wafer fabrication step), wafers are produced from materials such as silicon.

At step S304 (wafer processing step), the mask and wafer prepared in steps S301 to S303 are used to form an actual circuit on the wafer through lithography. At step S305 (device assembly step), the wafer processed in step S304 is assembled. The processes of dicing, bonding, and packaging (chip sealing) are included in step S305 as required.

Finally, at step S306 (inspection step), the device produced in step S305 undergoes inspections, such as an operation confirmation test and a reliability test. Upon successful completion of such inspection, the device is completed and shipped.

Figure 8:
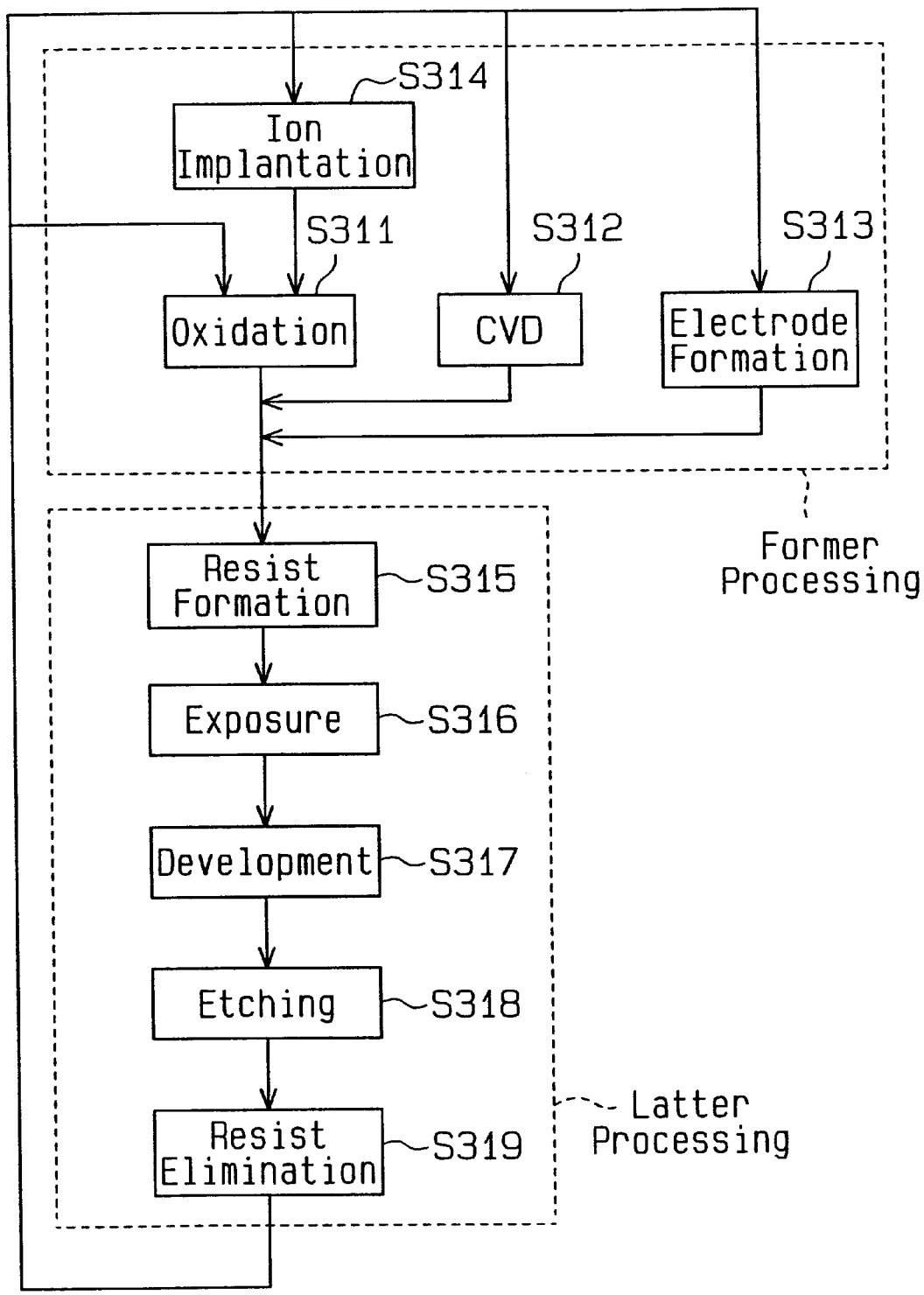
FIG. 8 is a flow chart for a wafer process of FIG. 7.
Figure 9:
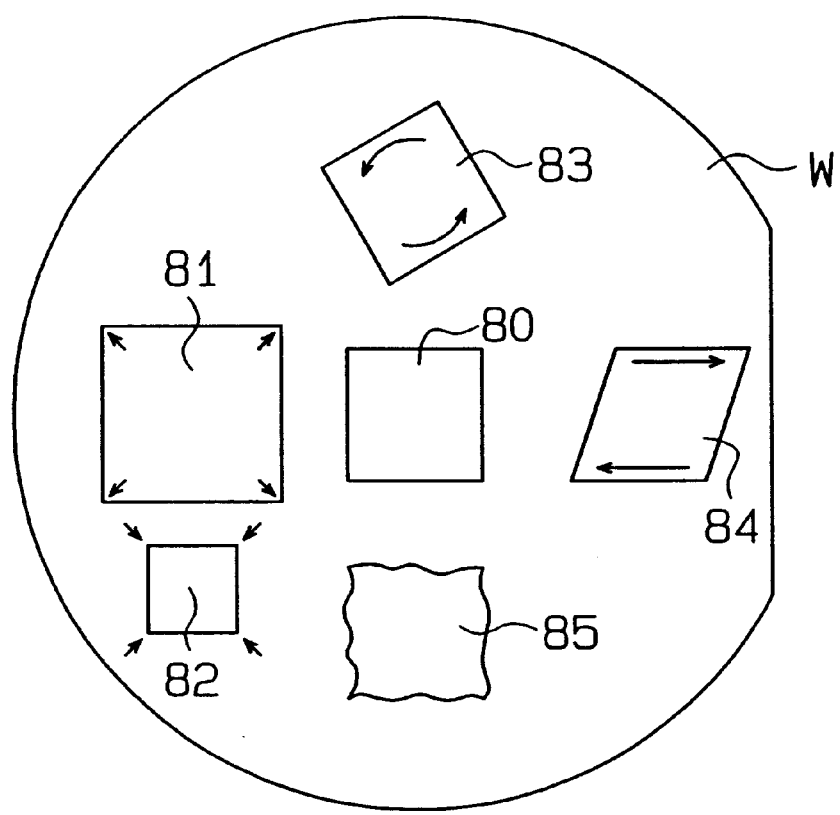
FIG. 9 is an illustration showing types of distortions generated on a wafer.

FIG. 8 shows in detail an example of how step S304 of FIG. 7 is performed when manufacturing a semiconductor device. At step S311 (oxidation step), the surface of the wafer is oxidized. At step S312 (CVD step), an insulative film is applied to the surface of the wafer. At step S313 (electrode formation step), electrodes are formed on the wafer through deposition. At step S314, (ion implantation step), ions are implanted in the wafer. When dividing the wafer processing step into former and latter processings, the above steps S311 to S314, which are selected and performed when required, are included in the former processing.

The latter processing is performed upon completion of the former processing. In the latter processing, at step S315 (resist formation step), a photosensitive agent is applied to the wafer. At step S316 (exposure step), the lithography system (exposure apparatus) transcribes the circuit pattern of the mask to the wafer. At step S318 (etching step), portions of the exposure member at which the resist is not remaining are etched and removed. At step S319, (resist elimination step), resist that has become unnecessary upon the completion of etching is removed. By repeating the former and latter processings, multiple circuit patterns are formed on the wafer.

The method for manufacturing a device in this embodiment uses the exposure apparatus during the exposure step (step S316). This improves resolution with the exposure light in the vacuum ultraviolet band and controls exposure with high accuracy. As a result, high density devices having a minimum line width of about 0.1 $\mu$m are efficiently yielded.

Therefore, the present examples and embodiments are to be considered as illustrative and not restrictive and the invention is not to be limited to the details given herein, but may be modified within the scope and equivalence of the appended claims.

What is claimed is:

1. An exposure apparatus for projecting a pattern image of a pattern formed on a mask onto a plurality of shot areas on a substrate, comprising:
   a substrate stage on which the substrate is mounted and which is movable together with the substrate when each of the shot areas is exposed; and
   a memory device that stores plural pieces of distortion information of the pattern image generated in accordance with a position of each of the shot areas on the substrate when the pattern image is being transferred onto each of the shot areas, wherein the plural pieces of distortion information are stored to correspond with each of the shot areas in advance.

2. The exposure apparatus according to claim 1, wherein the plural pieces of distortion information are stored in the memory device in relation to positional information of the substrate stage.

3. The exposure apparatus according to claim 1, further comprising:
   a mask stage on which the mask is mounted; and
   a projecting system for projecting the pattern image onto the substrate at a predetermined magnification,
   wherein the plural pieces of distortion information includes at least one of distortions of magnification due to the projecting system, rotation due to a relative rotational shift between the mask and the substrate, skew due to synchronous scanning of the mask stage and the substrate stage, and a shape component of the pattern image.

4. The exposure apparatus according to claim 1, further comprising:
   a compensator that compensates for the distortion of the pattern image using the plural pieces of distortion information stored in the memory device.

5. The exposure apparatus according to claim 4, wherein the compensator is connected to the memory device through a network.

6. The exposure apparatus according to claim 1, further comprising a measuring device that measures the plural pieces of distortion information.

7. The exposure apparatus according to claim 6, wherein the measuring device includes a detector that detects the pattern image transferred onto each of the shot areas by the exposure apparatus.

8. An exposure apparatus for projecting a pattern image of a pattern formed on a mask onto a plurality of shot areas on the substrate, comprising:
   a substrate stage on which the substrate is mounted and which is movable together with the substrate when each of the shot areas is exposed; and
   a compensator that compensates for distortion of the pattern image based on plural pieces of distortion information of the pattern image which are generated in accordance with a position of each of the shot areas on the substrate when the pattern image is being transferred onto each of the shot areas, wherein the plural pieces of distortion information correspond to each of the shot areas.

9. The exposure apparatus according to claim 8, further comprising:
   a mask stage on which the mask is mounted; and
   a projecting system that projects the pattern image onto the substrate,
   wherein the plural pieces of distortion information of the distortion include at least one of distortions of magnification due to the projecting system, rotation due to a relative rotational shift between the mask and the substrate, skew due to synchronous scanning of the mask stage and the substrate stage, and a shape component of the pattern image.

10. An exposure method for projecting a pattern image of a pattern formed on a mask onto a plurality of shot areas on a substrate, comprising the steps of:
    obtaining plural pieces of distortion information of the pattern image generated in accordance with a position of each of the shot areas on the substrate when the pattern image is being transferred onto each of the shot areas, wherein the plural pieces of distortion information correspond to each of the shot areas; and
    compensating for distortion of the pattern image based on the plural pieces of distortion information and exposing each of the shot areas.

11. The exposure method according to claim 10, wherein the plural pieces of distortion information includes at least one of distortions of magnification due to a projecting system that projects the pattern image onto the substrate, which is located on a substrate stage, at a predetermined magnification, rotation due to a relative rotational shift between the mask and the substrate, skew due to synchronous scanning of a mask stage on which the mask is mounted and a substrate stage on which the substrate is mounted, and a shape component of the pattern image.

12. The exposure method according to claim 10, wherein the step of obtaining the plural pieces of distortion information includes detecting the pattern image transferred onto each of the shot areas.

13. The exposure method according to claim 10, further comprising the steps of:
    comparing previously obtained plural pieces of distortion information with actual plural pieces of distortion information generated when performing the exposure step; and
    updating the previous plural pieces of distortion information in accordance with the comparison result.

14. A method for fabricating an exposure apparatus that projects a pattern image of a pattern formed on a mask onto a plurality of shot areas on a substrate, comprising the steps of:
    providing a substrate stage on which the substrate is mounted and which is movable together with the substrate when each of the shot areas is exposed; and
    providing a memory device that stores plural pieces of distortion information of the pattern image of the pattern image generated in accordance with a position of each of the shot areas on the substrate when the pattern image is being transferred onto each of the shot areas, wherein the plural pieces of distortion information are stored to correspond to each of the shot areas in advance.

15. A method for fabricating an exposure apparatus that projects a pattern image of a pattern formed on a mask onto a plurality of shot areas on a substrate, comprising the steps of:
    providing a substrate stage on which the substrate is mounted and which is movable together with the substrate when each of the shot areas is exposed; and
    providing a compensator that compensates for the distortion of the pattern image based on plural pieces of distortion information of the pattern image w hich are generated in accordance with a position of each of the shot areas on the substrate when the pattern image is being transferred onto each of the shot areas, wherein the plural pieces of distortion information correspond to each of the shot areas.

16. A method for fabricating a device by performing an exposure process that projects a pattern image of a pattern formed on a mask onto a plurality of shot areas on a substrate, comprising the steps of:

obtaining plural pieces of distortion information of the pattern image generated in accordance with a position of each of the shot areas on the substrate when the pattern image is being transferred onto each of the shot areas, wherein the plural pieces of distortion information correspond to each of the shot areas, substrate compensating for distortion of the pattern image based on the plural pieces of distortion information and exposing each of the shot areas; and assembling the device using the exposed substrate.

* * * * *